United States Patent [19]
Kim et al.

[11] Patent Number: 5,293,350
[45] Date of Patent: Mar. 8, 1994

[54] NONVOLATILE SEMICONDUCTOR MEMORY DEVICE

[75] Inventors: Jin-Ki Kim; Hyung-Kyu Lim, both of Seoul, Rep. of Korea

[73] Assignee: Samsung Electronics Co., Ltd., Kyungki

[21] Appl. No.: 18,240

[22] Filed: Feb. 17, 1993

[30] Foreign Application Priority Data

Feb. 19, 1992 [KR] Rep. of Korea ................ 1992-2485

[51] Int. Cl.$^5$ .............................................. G11C 7/00
[52] U.S. Cl. ............................ 365/238.5; 365/230.03; 365/185
[58] Field of Search ................ 365/230.03, 230.06, 365/238.5, 185, 189.05

[56] References Cited

U.S. PATENT DOCUMENTS

4,878,203 10/1989 Arakawa ............... 365/230.03 X
5,065,364 11/1991 Atwood et al. .................. 365/185

*Primary Examiner*—Joseph A. Popek
*Attorney, Agent, or Firm*—Robert A. Westerlund; Charles R. Donohoe

[57] ABSTRACT

A nonvolatile semiconductor memory device having a page program mode of operation. The device including a data input buffer for receiving program data from a data line and a plurality of program voltage generating circuits each of which is selectively operable for generating a program voltage output having a first and second logic level. The device further including a plurality of first selecting MOS transistors coupled to respective ones of the program voltage generating circuits and alternating ones of bit lines included in the memory device and a plurality of second selecting MOS transistors coupled to respective ones of the program voltage generating circuits and a second sequences of alternating one of the bit lines. A select circuit having a first output connected to each of the first selecting transistors and a second output connected to each of the second selecting transistors for selectively turning on either of the first and second selecting transistors to thereby selectively couple either the bit lines of the first and second sequence to the program voltage output of the respective ones of the program voltage generating circuits.

20 Claims, 4 Drawing Sheets

NONVOLATILE SEMICONDUCTOR MEMORY DEVICE

BACKGROUND OF THE INVENTION

The present invention relates generally to nonvolatile semiconductor memory devices, and more particularly, to an electrically erasable and programmable read only memory (EEPROM) device having a page program mode and which is characterized by a unique architecture which provides a higher level of integration density than is possible with currently available EEPROMs having a page program mode.

Various methods have been heretofore proposed for improving the operating speed of nonvolatile semiconductor memory devices such as EEPROMs, flash EEPROMs, and the like. One of these methods, commonly referred to as a page program mode, is performed by temporarily storing data in a data buffer and simultaneously writing the data in a selected column of the memory array, thereby minimizing the time for programming data into the memory device.

Known techniques for implementing the page program mode are disclosed, for example, in IEEE JOURNAL OF SOLID-STATE CIRCUITS, Vol. 24, No. 5, October 1988, pp. 1238-1243 and IEEE JOURNAL OF SOLID-STATE CIRCUITS, Vol. 23, No. 5, October 1988, pp. 1164-170. With these known techniques, a data storing circuit for storing data and a program voltage generating circuit for generating a program voltage are connected to every bit line. Because these techniques require that the data storing circuit and the program voltage generating circuit be connected to every bit line, there is an inherent limitation on the size of the memory cells or the width between bit lines, thereby limiting the level of integration density of the semiconductor memory device.

Based upon the above and foregoing, it can be appreciated that there presently exists a need in the art for a nonvolatile semiconductor memory device having a page program mode which overcomes the above-described limitation and shortcoming of the presently available nonvolatile semiconductor memory devices having a page program mode.

SUMMARY OF THE INVENTION

The present invention encompasses a nonvolatile semiconductor memory device having a page program mode of operation, including a memory cell array comprised of a plurality of memory cells connected to a plurality of intersecting row lines and bit lines at the intersections thereof; a row decoder responsive to row address signals for selectively activating a selected one of the row lines; a data input buffer for receiving program data; a data line connected at one end thereof to the data input buffer; a plurality of column selecting MOS transistors each having a gate electrode, a first electrode connected to a respective one of the bit lines, and a second electrode connected to the data line; a column decoder having a plurality of outputs connected to the gate of respective ones of the column selecting MOS transistors, the column decoder being responsive to column address signals for electrically connecting a selected one of the bit lines to the data line; a plurality of program voltage generating circuits each of which is selectively operable for generating a program voltage output having a first or second logic level, dependent upon the logic level of the program data; alternating pairs of the bit lines being commonly connected to the program voltage output of respective ones of the program voltage generating circuits; a plurality of first selecting MOS transistors having a first electrode connected to the program voltage output of respective ones of the program voltage generating circuits, a second electrode connected to respective ones of a first sequence of alternating ones of the bit lines, and a gate electrode; a plurality of second selecting MOS transistors having a first electrode connected to the program voltage output of the respective ones of said program voltage generating circuits, a second electrode connected to respective ones of a second sequence of alternating ones of the bit lines, and a gate electrode, the bit lines of the second sequence being interposed between the bit lines of the first sequence; and, a select circuit having a first output connected to the gate electrode of each of the first selecting MOS transistors and a second output connected to the gate electrode of each of the second selecting MOS transistors, the select circuit being selectively operable for selectively turning on either the first selecting MOS transistors or the second selecting MOS transistors, to thereby selectively couple either the bit lines of the first sequence or the bit lines of the second sequence to the program voltage output of the respective ones of the program voltage generating circuits.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

For purposes of illustrating the principles of the present invention, it is described hereinafter in terms of a NAND-logic 1Mb nonvolatile semiconductor memory device comprised of two blocks of memory cells each comprised of 1024 rows and 512 columns of memory cells such as described in U.S. Pat. No. 4,962,481 the disclosure of which is incorporated herein by reference. However, it should be clearly understood that the exact type and size of nonvolatile semiconductor memory device employed in the practice of the present invention is not limiting thereto.

Figure 1:
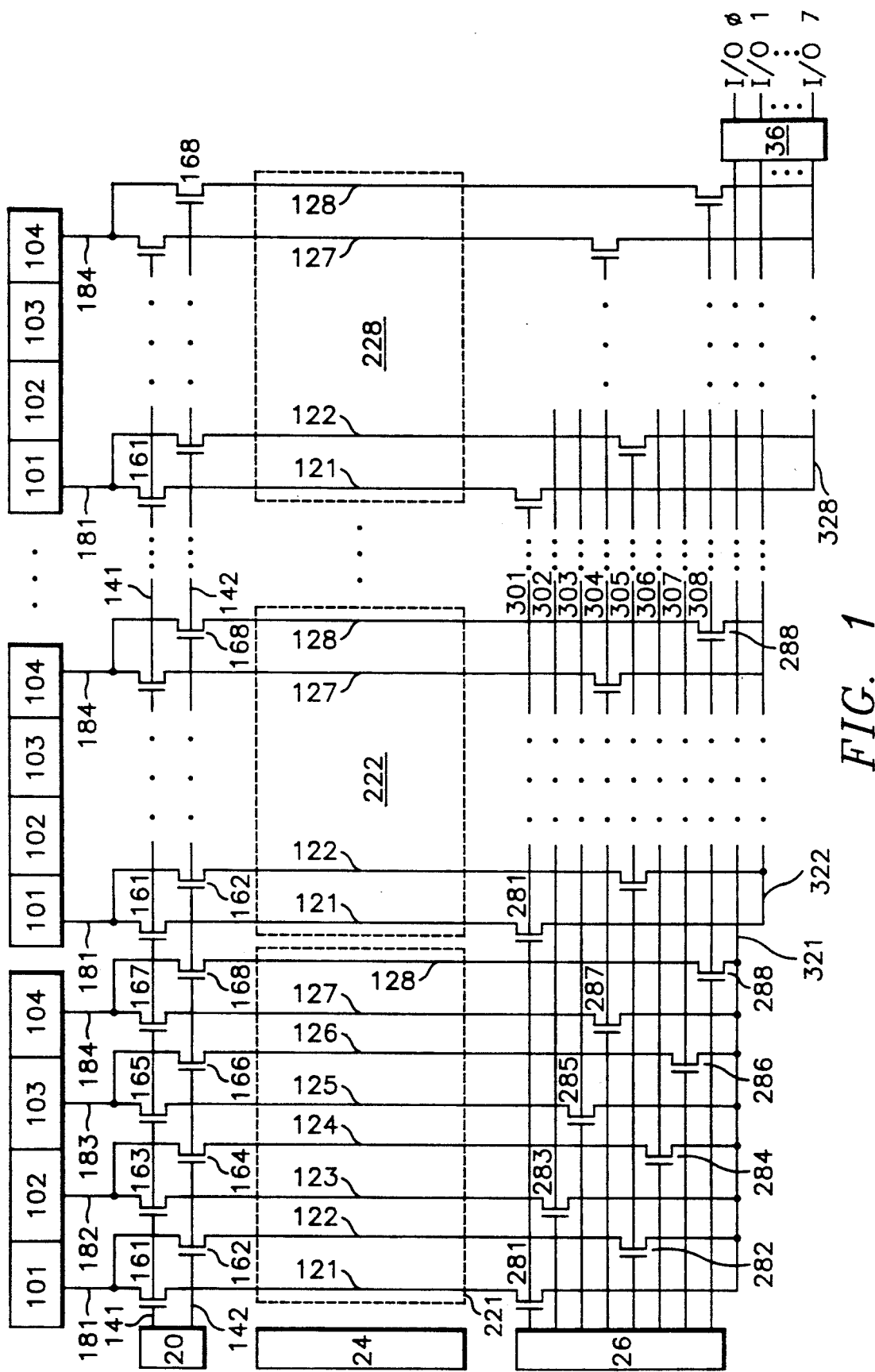
FIG. 1 is a partial block, partial schematic diagram of a nonvolatile semiconductor memory device constructed in accordance with the principles of the present invention.

With reference now to FIG. 1, there can be seen one of the memory blocks of the 1Mb nonvolatile semiconductor memory device constructed in accordance with the principles of the present invention. This memory block is comprised of eight sub-arrays of memory cells (hereinafter referred to as "memory sub-arrays") 221-228 each having eight columns 121-128. Thus, this memory block has a total of sixty-four (64) columns. Although not shown in the drawing, each of the columns 121-128 of each memory sub-array 221-228 has 1024 floating gate MOS transistors connected thereto, in a manner which is well-known in the art. One terminal of the column lines 121-128 in each memory sub-array 221-228 is connected through corresponding column selecting transistors 281-288 to respective data lines 321-328. For example, the column lines 121-128 of the memory sub-array 221 are commonly connected to the data line 321 through the column selecting transistors 281-288, respectively.

In accordance with the present invention, the odd column lines 121, 123, 125 and 127 of each of the memory sub-arrays 221-228 are connected to the sources (or drains) of first selecting transistors 161, 163, 165 and 167, respectively, and the even column lines 122, 124, 126 and 128 are connected to the sources (or drains) of second selecting transistors 162, 164, 166 and 168, respectively. The drains (or sources) of the pairs of first and selecting transistors 161 and 162, 163 and 164, 165 and 166, and 167 and 168 are commonly coupled to lines 181, 182, 183 and 184, respectively. The lines 181, 182, 183 and 184 are connected to program voltage generating circuits 101, 102, 103 and 104, respectively. The program voltage generating circuits 101, 102, 103 and 104 each function to generate a program voltage of high voltage, in a manner which will be fully developed hereinafter. The gates of the first selecting transistors 161, 163, 165 and 167 are commonly connected to a first program selection line 141, and the gates of the second selecting transistors 162, 164, 16 and 168 are commonly connected to a second program selection line 142. The first and second program selection lines 141 and 142 are coupled to a select circuit 20 which functions to selectively activate either the first or second program selection line in response to program instruction and address signals (not shown) applied to respective input terminals (not shown) of the select circuit 20. The select circuit 20, the program voltage generating circuits 101, 102, 103 and 104, and the first and second selecting transistors 161-168 cooperatively function to generate the program voltage and to supply the generated program voltage to a selected one of the column (bit) lines, in a manner which will be fully developed hereinafter.

The gate electrodes of the column selecting transistors 281-288 in each memory sub-array 221-228 are connected to column selection lines 301-308, respectively. The column selection lines 301-308 are connected to a column decoder 26, which functions, in response to column address signals (not shown) applied thereto, to activate a selected one of the column selection lines 301-308. In addition, the data lines 321-328 are connected to a data input buffer 36 for receiving program data provided on input/output lines I/00-I/07 connected to the data input buffer 36.

A row decoder 24 functions, in response to row address signals (not shown) applied thereto, to activate a selected one of the row lines (not shown) in the memory sub-arrays, by applying a given voltage to the selected row line, to thereby read or erase data from the memory cells (not shown) connected to the selected row line, or to program data into the memory cells connected to the selected row line.

Figure 2:
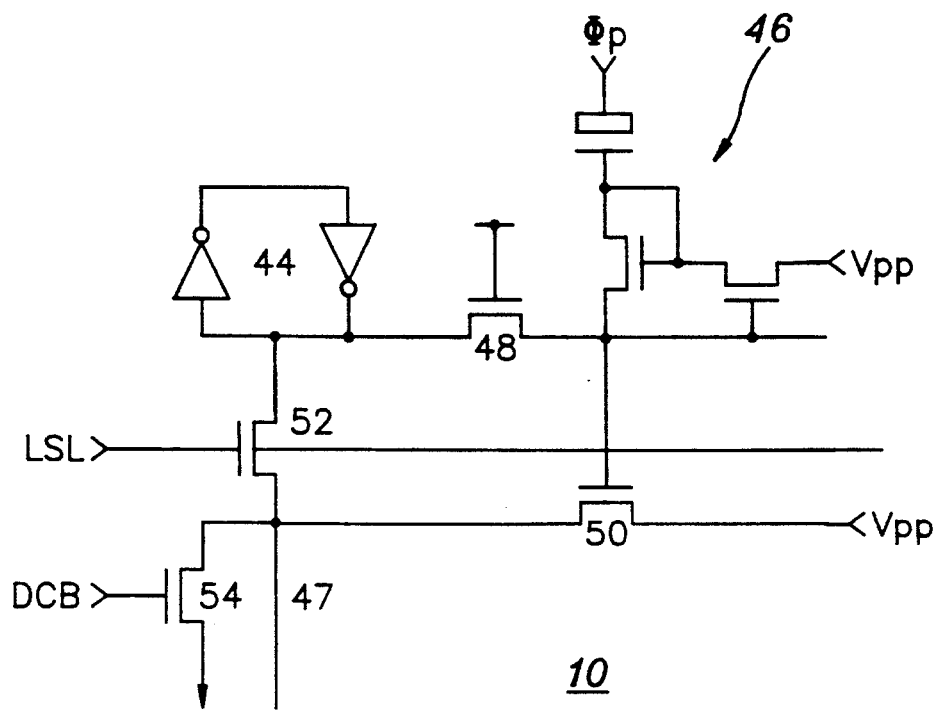
FIG. 2 is a schematic diagram of a program voltage generating circuit of the semiconductor memory device depicted in FIG. 1.

With reference now to FIG. 2, there can be seen the program voltage generating circuit 101. It should be understood that each of the other program voltage generating circuits (102-104) in each memory sub-array is identical in construction to the program voltage generating circuit 101 depicted in FIG. 2. The program voltage generating circuit 101 includes a latch circuit 44 for temporarily storing data and a charge pump circuit 46 for supplying a high voltage Vpp necessary for programming the gate of a high voltage transfer transistor 50, in a manner which will become apparent hereinafter. The program voltage generating circuit 101 also includes a transfer transistor 48 connected between the latch circuit 44 and the charge pump circuit 46, with an electrode of the transfer transistor 48 being connected to the gate of a high voltage transfer transistor 50, for transferring a high voltage to the bit line (connected to line 47), which is necessary for programming the bit line (e.g., bit line 121). Further, the program voltage generating circuit 101 includes a latch selecting transistor 52 for connecting the bit line to the latch circuit 44, and a bit line discharge transistor 54 for discharging the voltage remaining on the bit line, in response to an input signal DCB, upon completion of a page program operation, in a manner which will become apparent hereinafter.

Figure 3:
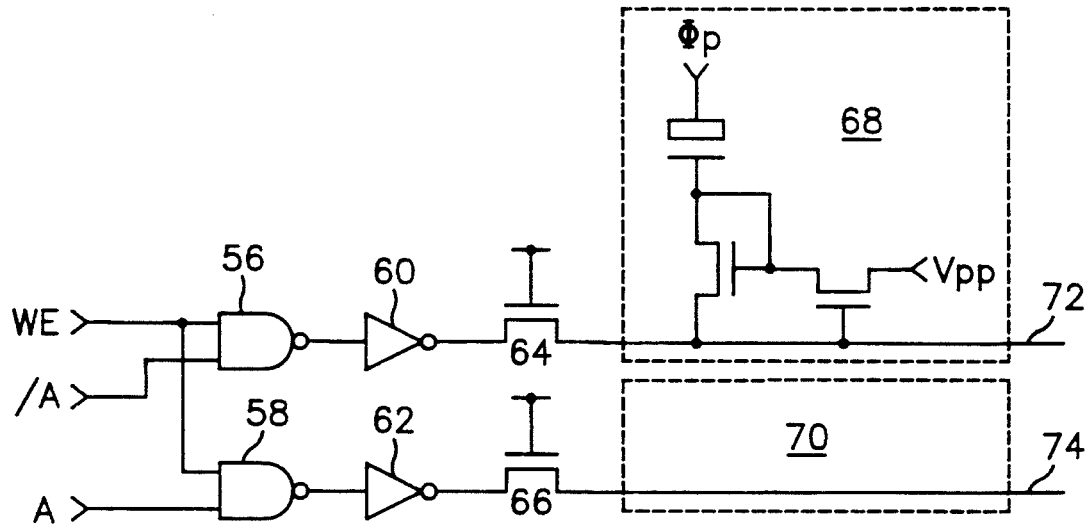
FIG. 3 is a schematic diagram of a program selection line select circuit of the semiconductor memory device depicted in FIG. 1.

With reference now to FIG. 3, there can be seen the program selection line select circuit 20 of FIG. 1, which includes first and second NAND gates 56, 58, respectively. An inverted external input address signal /A and a program enable signal WE are applied as inputs to the first NAND gate 56, and an external input address signal A and the program enable signal WE are applied as inputs to the second NAND gate 58. The output of the first NAND gate 56 is applied to one electrode of a first transfer transistor 64 through a first inverter 60, and the output of the second NAND gate 58 is applied to one electrode of a second transfer transistor 66 through a second inverter 62. First and second charge pump circuits 68 and 70 supply a high voltage to first and second bit line selection lines 72 and 74, respectively. The program selection line select circuit 20 selects a bit line to be programmed by turning on the first or second selecting transistor (161-168) corresponding to the selected bit line.

Figure 4:
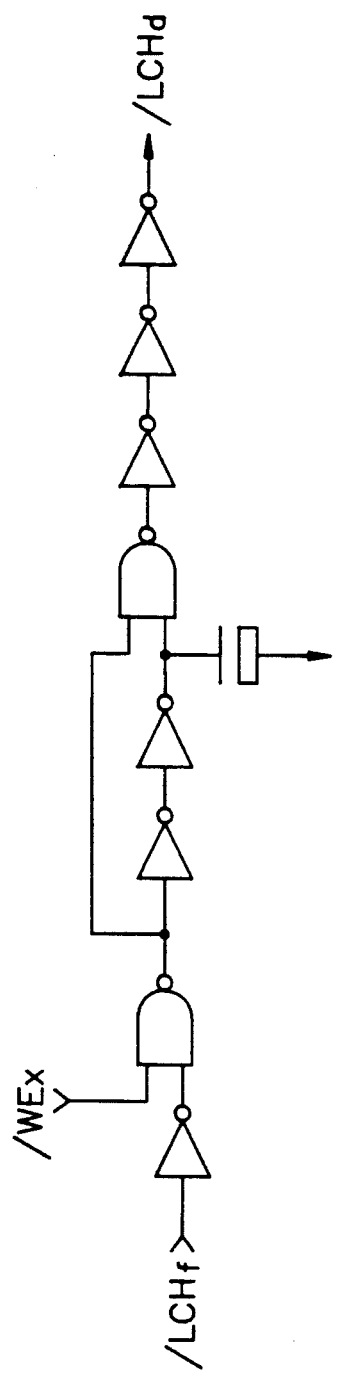
FIG. 4 is a schematic diagram of a circuit for controlling the data input buffer of the semiconductor memory device depicted in FIG. 1.

With reference now to FIG. 4, there can be seen a data input buffer data transfer control circuit (not shown in FIG. 1), which generates an output /LCHd which control the data transfer function of the data input buffer 36, in response to a data input buffer enable signal /LCHf and an external input program enable signal /WEx. If the data input buffer enable signal LCHf is at a logic "low" level, and the external input program enable signal /WEx is changed from a logic "low" level to a logic "high" level, the signal /LCHd is changed from a logic "low" level to a logic "high" level, and vice versa.

Figure 5:
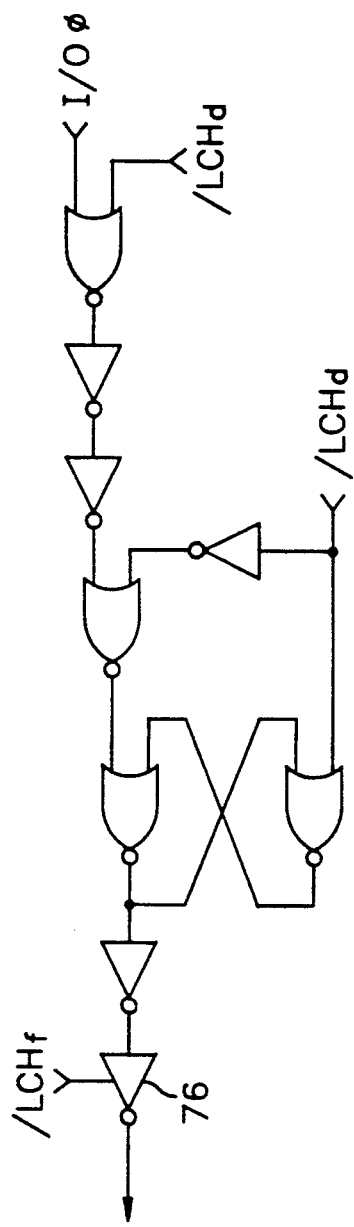
FIG. 5 is schematic diagram of a unit data input buffer circuit of the data input buffer of the semiconductor memory device depicted in FIG. 1; and, FIG. 6 is a timing diagram showing the relative relationship of the various signals generated by the various circuits of the semiconductor memory device depicted in FIGS. 1-5.

With reference now to FIG. 5, there can be seen a unit input buffer of the data input buffer 36, it being understood that the data input buffer 36 of FIG. 1 includes eight (8) unit input buffers like the one shown in FIG. 5. In operation, data to be programmed is stored in the data input buffer in response to the signal /LCHd being driven to its logic "low" level. When the data input buffer enable signal /LCHf is at its logic "low" level, the data input buffer 36 functions to transfer the stored data to the selected data line (321-328). When the data input buffer enable signal /LCHF is at its logic "high" level, a tri-state buffer 76 maintains a floating state, while data to be programmed is stored in the data input buffer.

Figure 6:
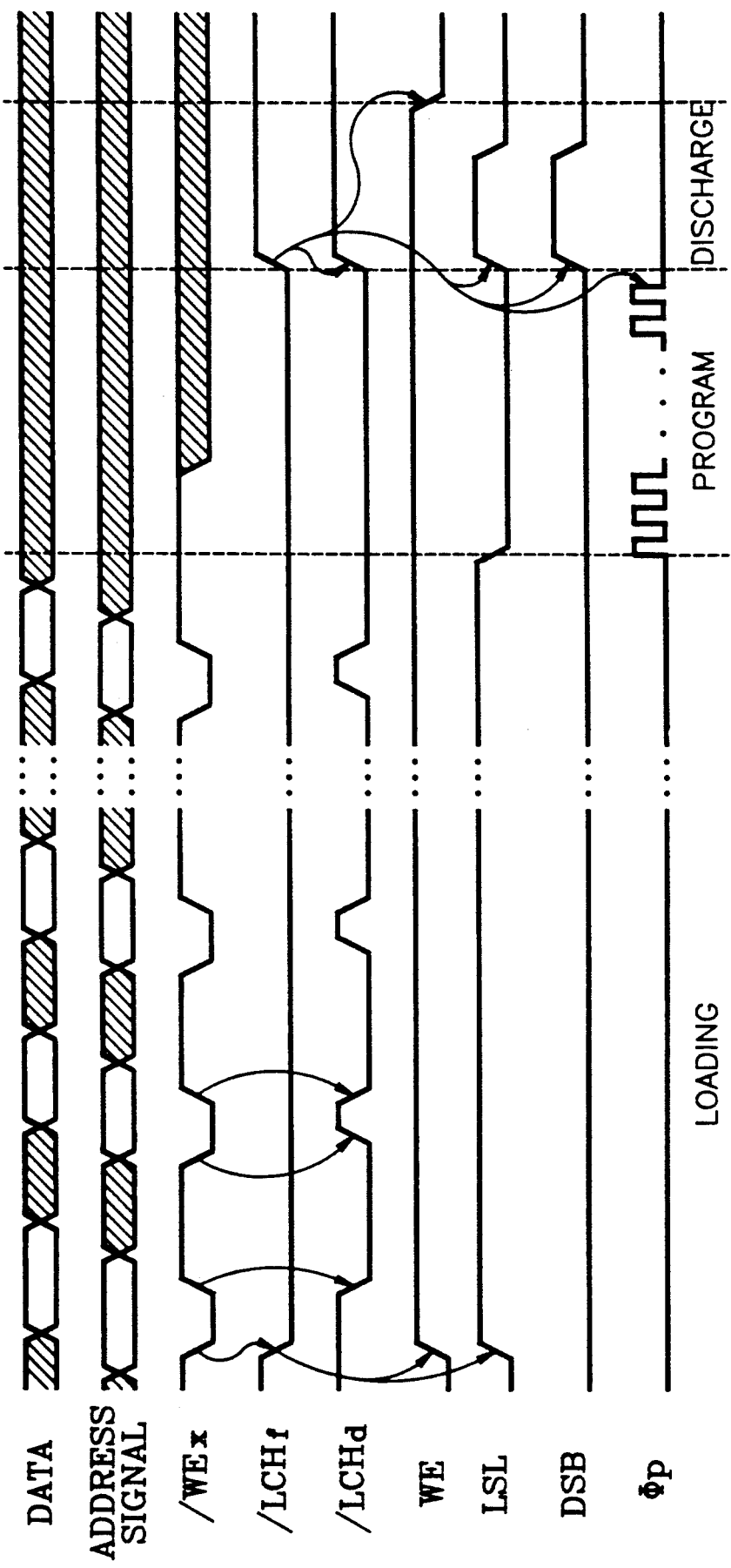

With reference now to the timing diagram of FIG. 6, the page program mode of operation of the semiconductor memory device of the present invention will now be described. Generally, the page program mode is implemented by executing a data loading operation, a program operation, and a discharge operation, in a manner described below.

In the data loading operation, the external address signals (not shown) are supplied to the circuits 20, 24, and 26, and the data to be programmed into the memory device is supplied over the input/output lines I/O0-I/O7 to the data input buffer 36. Further, to initiate the data loading operation, the external input program enable signal /WEx is changed to its logic "low" level, and a control signal LSL coupled to the gate of the bit line latch selecting transistor 52 is changed to a logic "high" level. At this time, the data input buffer enable signal /LCHf is maintained at its logic "low" level. Then, the external input program enable signal /WEx is changed to its logic "high" level, thereby changing the signal /LCHd to its logic "low" level, which results in the data being temporarily stored in the data input buffer 36. Then, the external input program enable signal /WEx is changed back to its logic "low" level, thereby changing the signal /LCHd to its logic "high" level, which results in the stored data being transferred to the data lines 321-328. The data is then transferred from the data lines 321-328 to the bit lines 121-128 through the column selecting transistors 281-288 operated by the column decoder 26. The transferred data is then stored in the latch circuit 44 of the program voltage generating circuits 101, 102, 103 and 104 through the first and second selecting transistors 161-168, which are controlled by the program selection line select circuit 20, which is responsive to the external input address signals applied thereto. By repeating the above sequence of steps, all of the data in the page program is loaded or stored in the latch circuit 44 of the program voltage generating circuits 101, 102, 103 and 104. Of course, after all of the data in the page program is loaded, the data loading operation is completed.

Upon completion of the data loading operation, the program operation is initiated by changing the signal LSL to its logic "low" level, thereby rendering the latch selecting transistor 52 nonconductive. Next, an oscillating signal ≠p is applied to the charge pump circuit 46 of the program voltage generating circuits. If the data stored in the latch circuit 44 (e.g., of the program voltage generating circuit 100) is logic "high", a high voltage is transferred to the high voltage transfer transistor 50 by the charge pump circuit 46, thereby causing a high voltage Vpp to be transferred to the bit line 121 or 122, depending upon which of the first and second selecting transistors 161 or 162 is selected by the program selection line select circuit 20. As previously stated, this high voltage is necessary for programming, and thus, is referred to as the program voltage. During the program operation, the column selecting transistors 281-288 are turned off, thereby preventing the program voltage from being transferred to the data lines 321-328.

It should be noted that a significant advantage of the present invention resides in the fact that two bit lines share a common program voltage generating circuit, thereby enabling the size of the memory cells and/or the width between bit lines to be reduced, thus increasing the integration density of the semiconductor memory device. Thus, the page program mode is peformed by means of the program selection line select circuit 20 selecting one of the bit lines of each bit line pair connected to respective ones of the program voltage generating circuits, in each memory sub-array, after the program (input) data is temporarily stored in each of the program voltage generating circuits.

Upon completion of the page program operation, the discharge operation is initiated by changing the signal LSL to its logic "high" level, thereby electrically separating (isolating) the program voltage generating circuits from the bit lines. Further, the signal DCB applied to the gate of the bit line discharge transistor 54 of the program voltage generating circuits is changed to its logic "high" level, thereby discharging the remaining voltage on the bit lines to ground through the bit line discharge transistor 54 thereof.

Although the present invention has been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A nonvolatile semiconductor memory device having a page program mode of operation, comprising:
   a memory cell array comprised of a plurality of memory cells connected to a plurality of intersecting row lines and bit lines at the intersections thereof;
   a row decoder responsive to row address signals for selectively activating a selected one of said row lines;
   a data input buffer for receiving program data;
   a data line connected at one end thereof to said data input buffer;
   a plurality of column selecting MOS transistors each having a gate electrode, a first electrode connected to a respective one of said bit lines, and a second electrode connected to said data line;
   a column decoder having a plurality of outputs connected to said gate electrode of respective ones of said column selecting MOS transistors, said column decoder being responsive to column address signals for electrically connecting a selected one of said bit lines to said data line;
   a plurality of program voltage generating circuits each of which is selectively operable for generating a program voltage output having a first or second logic level, dependent upon the logic level of said program data;
   alternating pairs of said bit lines being commonly connected to said program voltage output of respective ones of said program voltage generating circuits;
   a plurality of first selecting MOS transistors having a first electrode connected to said program voltage output of respective ones of said program voltage generating circuits, a second electrode connected to respective ones of a first sequence of alternating ones of said bit lines, and a gate electrode;

a plurality of second selecting MOS transistors having a first electrode connected to said program voltage output of said respective ones of said program voltage generating circuits, a second electrode connected to respective ones of a second sequence of alternating ones of said bit lines, and a gate electrode, said bit lines of said second sequence being interposed between said bit lines of said first sequence; and, a select circuit having a first output connected to said gate electrode of each of said first selecting MOS transistors and a second output connected to said gate electrode of each of said second selecting MOS transistors, said select circuit being selectively operable for selectively turning on either said first selecting MOS transistors or said second selecting MOS transistors, to thereby selectively couple either said bit lines of said first sequence or said bit lines of said second sequence to said program voltage output of said respective ones of said program voltage generating circuits.

2. The memory device as set forth in claim 1, wherein the memory device is a NAND-logic type memory device.

3. The memory device as set forth in claim 2, wherein the memory device is a EEPROM.

4. The memory device as set forth in claim 1, wherein said memory cell array is comprised of a plurality of memory cell sub-arrays, and wherein further, each of said memory cell sub-arrays includes a plurality of said program voltage generating circuits and a separate data line, with each of said separate data lines being connected at one end thereof to said data input buffer.

5. The memory device as set forth in claim 1, wherein each of said program voltage generating circuits includes a latch circuit for temporarily storing said program data.

6. The memory device as set forth in claim 5, wherein each of said program voltage generating circuits further includes a discharge circuit which is selectively operable, in response to completion of a page program operation, to discharge said bit lines.

7. The memory device as set forth in claim 6, wherein said data input buffer includes a data latch circuit for temporarily storing said program data.

8. The memory device as set forth in claim 7, wherein said data input buffer further includes means for transferring data temporarily stored in said data latch circuit to said data line.

9. The memory device as set forth in claim 5, wherein said data input buffer includes a data latch circuit for temporarily storing said program data.

10. The memory device as set forth in claim 9, wherein said data input buffer further includes means for transferring data temporarily stored in said data latch circuit to said data line.

11. A nonvolatile semiconductor memory device having a page program mode of operation, comprising:
a memory cell array comprised of a plurality of memory cells connected to a plurality of row lines and bit lines;
means for activating a selected one of said row lines;
a data input buffer for receiving input data;
a data line connected to said data input buffer;
means for electrically connecting a selected one of said bit lines to said data line;
a plurality of program voltage generating means for generating a program voltage output;

alternating pairs of said bit lines being commonly connected to said program voltage output of respective ones of said program voltage generating means; and, means for selectively coupling each of a first sequence of alternating ones of said bit lines or each of a second sequence of alternating ones of said bit lines to said program voltage output of said respective ones of said program voltage generating means.

12. The memory device as set forth in claim 11, wherein said bit lines of said second sequence are interposed between said bit lines of said first sequence.

13. The memory device as set forth in claim 12, wherein said selectively coupling means comprises:
a plurality of first selecting MOS transistors having a first electrode connected to said program voltage output of said respective ones of said program voltage generating means, a second electrode connected to respective bit lines of said first sequence, and a gate electrode;

a plurality of second selecting MOS transistors having a first electrode connected to said program voltage output of said respective ones of said program voltage generating means, a second electrode connected to respective bit lines of said second sequence, and a gate electrode; and, a select circuit having a first output connected to said gate electrode of each of said first selecting MOS transistors and a second output connected to said gate electrode of each of said second selecting MOS transistors, said select circuit being selectively operable for selectively turning on either said first selecting MOS transistors or said second selecting MOS transistors, to thereby selectively couple either said bit lines of said first sequence or said bit lines of said second sequence to said program voltage output of said respective ones of said program voltage generating circuits.

14. The memory device as set forth in claim 13, wherein the memory device is a EEPROM.

15. The memory device as set forth in claim 11, wherein the memory device is a NAND-logic type memory device.

16. The memory device as set forth in claim 11, wherein said memory cell array is comprised of a plurality of memory cell sub-arrays, and wherein further, each of said plurality of memory cell sub-arrays includes a plurality of said program voltage generating means and a separate data line, with each of said separate data lines being connected to said data input buffer.

17. The memory device as set forth in claim 11, wherein each of said program voltage generating means includes a latch circuit for temporarily storing said input data.

18. The memory device as set forth in claim 17, wherein said data input buffer includes a data latch circuit for temporarily storing said input data.

19. The memory device as set forth in claim 18, wherein said data input buffer further includes means for transferring data temporarily stored in said data latch circuit to said data line.

20. The memory device as set forth in claim 19, wherein each of said program voltage generating means further includes a discharge circuit which is selectively operable, in response to completion of a page program operation, for discharging said bit lines.

* * * * *